United States Patent
Gaun et al.

(10) Patent No.: US 7,378,682 B2
(45) Date of Patent: May 27, 2008

(54) MEMORY ELEMENT USING ACTIVE LAYER OF BLENDED MATERIALS

(75) Inventors: David Gaun, Brookline, MA (US); Swaroop Kaza, Woburn, MA (US); Stuart Spitzer, Lynnfield, MA (US); Juri Krieger, Brookline, MA (US); Richard Kingsborough, Acton, MA (US)

(73) Assignee: Spanson LLC, Sunnyvale, CA (US)

( * ) Notice: Subject to any disclaimer, the term of this patent is extended or adjusted under 35 U.S.C. 154(b) by 473 days.

(21) Appl. No.: 11/052,688

(22) Filed: Feb. 7, 2005

(65) Prior Publication Data
US 2006/0175646 A1   Aug. 10, 2006

(51) Int. Cl.
*H01L 51/00* (2006.01)
(52) U.S. Cl. ........................ 257/40; 257/642; 257/643; 257/E21.011; 257/E51.027; 257/E51.03; 438/99; 438/190
(58) Field of Classification Search ................... 257/40, 257/642, 643
See application file for complete search history.

(56) References Cited

U.S. PATENT DOCUMENTS

| | | | |
|---|---|---|---|
| 5,563,424 A | 10/1996 | Yang et al. | 257/40 |
| 7,122,853 B1* | 10/2006 | Gaun et al. | 257/295 |
| 2004/0238864 A1 | 12/2004 | Tripsas et al. | 257/296 |
| 2006/0038169 A1* | 2/2006 | Mandell et al. | 257/40 |
| 2006/0038982 A1* | 2/2006 | Spitzer et al. | 356/151 |

FOREIGN PATENT DOCUMENTS

WO    WO 02/37500    5/2002

OTHER PUBLICATIONS

Brennan et al., Polyfluorenesas Organicsemiconductorsfor Polymericfield Effect Transistors,SPIE vol. 5217, pp. 1-, 20036.
Kinder et al., StructuralOrderingin F8T2 Polyfluorenethin-Film Transistors,SPIE vol. 5217, pp. 36-37, 2003.

* cited by examiner

*Primary Examiner*—Dao H Nguyen

(57) ABSTRACT

The present memory device has first and second electrodes, a passive layer between the first and second electrodes and on and in contact with the first electrode, and an active layer between the first and second electrodes and on and in contact with the passive layer and second electrode, for receiving a charged specie from the passive layer. The active layer is a mixture of (i) a first polymer, and (ii) a second polymer for enhancing ion transport, improving the interface and promoting a rapid and substantially uniform distribution of the charged specie in the active layer, i.e., preventing a localized injection of the charged species. These features result in a memory element with improved stability, a more controllable ON-state resistance, improved switching speed and a lower programming voltage.

10 Claims, 3 Drawing Sheets

MEMORY ELEMENT USING ACTIVE LAYER OF BLENDED MATERIALS

BACKGROUND OF THE INVENTION

1. Technical Field

This invention relates generally to memory devices, and more particularly, to memory element fabrication and configuration.

2. Background Art

The volume, use and complexity of computers and electronic devices are continually increasing. Computers consistently become more powerful, new and improved electronic devices are continually developed (e.g., digital audio players, video players). Additionally, the growth and use of digital media (e.g., digital audio, video, images, and the like) have further pushed development of these devices. Such growth and development has vastly increased the amount of information desired/required to be stored and maintained for computer and electronic devices.

Generally, information is stored and maintained in one or more of a number of types of storage devices. Storage devices include long term storage mediums such as, for example, hard disk drives, compact disk drives and corresponding media, digital video disk (DVD) drives, and the like. The long term storage mediums typically store larger amounts of information at a lower cost, but are slower than other types of storage devices. Storage devices also include memory devices, which are often, but not always, short term storage mediums. Memory devices tend to be substantially faster than long term storage mediums. Such memory devices include, for example, dynamic random access memory (DRAM), static random access memory (SRAM), double data rate memory (DDR), flash memory, read only memory (ROM), and the like. Memory devices are subdivided into volatile and non-volatile types. Volatile memory devices generally lose their information if they lose power and typically require periodic refresh cycles to maintain their information. Volatile memory devices include, for example, random access memory (RAM), DRAM, SRAM and the like. Non-volatile memory devices maintain their information whether or not power is maintained to the devices. Non-volatile memory devices include, but are not limited to, ROM, programmable read only memory (PROM), erasable programmable read only memory (EPROM), flash memory and the like. Volatile memory devices generally provide faster operation at a lower cost as compared to non-volatile memory devices.

Memory devices generally include arrays of memory cells. Each memory cell can be accessed or "read", "written", and "erased" with information. The memory cells maintain information in an "off" or an "on" state, also referred to as "0" and "1". Typically, a memory device is addressed to retrieve a specified number of byte(s) (e.g. 8 memory cells per byte). For volatile memory devices, the memory cells must be periodically "refreshed" in order to maintain their state. Such memory devices are usually fabricated from semiconductor devices that perform these various functions and are capable of switching and maintaining the two states. The devices are often fabricated with inorganic solid state technology, such as, crystalline silicon devices. A common semiconductor device employed in memory devices is the metal oxide semiconductor field effect transistor (MOSFET).

The use of portable computer and electronic devices has greatly increased demand for non-volatile memory devices. Digital cameras, digital audio players, personal digital assistants, and the like generally seek to employ large capacity non-volatile memory devices (e.g., flash memory, smart media, compact flash, and the like).

Because of the increasing demand for information storage, memory device developers and manufacturers are constantly attempting to increase storage capacity for memory devices (e.g., increase storage per die or chip). A postage-stamp-sized piece of silicon may contain tens of millions of transistors, each transistor as small as a few hundred nanometers. However, silicon-based devices are approaching their fundamental physical size limits. Inorganic solid state devices are generally encumbered with a complex architecture which leads to high cost and a loss of data storage density. The volatile semiconductor memories based on inorganic semiconductor material must constantly be supplied with electric current with a resulting heating and high electric power consumption in order to maintain stored information. Non-volatile semiconductor devices have a reduced data rate and relatively high power consumption and large degree of complexity. Typically, fabrication processes for such cells are also not reliable.

Therefore, there is a need to overcome the aforementioned deficiencies.

FIG. 1 illustrates a type of memory element 30, which includes advantageous characteristics for meeting these needs. The memory element 30 includes an electrode 32 (for example copper), a copper sulfide layer 34 on the electrode 32, an active layer 36, for example a polymer layer, on the layer 34, and an electrode 38 (for example titanium) on the active layer 36. Initially, assuming that the memory element 30 is unprogrammed, in order to program the memory element 30, a negative voltage is applied to the electrode 38, while the electrode 32 is held at ground, so that an electrical potential $V_{pg}$ (the "programming" electrical potential) is applied across the memory element 30 from a higher to a lower electrical potential in the forward direction of the memory element 30 (see FIG. 2, a plot of memory element current vs. electrical potential applied across the memory element 30). This potential is sufficient to cause electrical species, in this case copper ions, to be attracted from the layer 34 toward the electrode 38 and into the active layer 36 (A), causing the active layer 36 (and the overall memory element 30) to be in a (forward) low-resistance or conductive state. Upon removal of such potential (B), the ions drawn into the active layer 36 during the programming step remain therein, so that the active layer 36 (and memory element 30) remain in a conductive or low-resistance state. The switching speed of the device 30 from the unprogrammed to the programmed state thereof is the time needed to move along the curve A from point C to point D thereon.

In the read step of the memory element 30 in its programmed (conductive) state, an electrical potential $V_r$ (the "read" electrical potential) is applied across the memory element 30 from a higher to a lower electrical potential in the forward direction of the memory element 30. This electrical potential is less than the electrical potential $V_{pg}$ applied across the memory element 30 for programming (see above). In this situation, the memory element 30 will readily conduct current, which indicates that the memory element 30 is in its programmed state.

In order to erase the memory element, a positive voltage is applied to the electrode 38, while the electrode 32 is held at ground, so that an electrical potential $V_{er}$ (the "erase" electrical potential) is applied across the memory element 30 from a higher to a lower electrical potential in the reverse direction of the memory element 30. This potential is sufficient to cause copper ions to be repelled from the active layer 36 toward the electrode 32 and into the layer 34, causing the active layer 36 (and the overall memory element 30) to be in a high-resistance or substantially non-conductive state. This state remains upon removal of such potential from the memory element 30.

In the read step of the memory element 30 in its erased (substantially non-conductive) state, the electrical potential $V_r$ is again applied across the memory element 30 from a higher to a lower electrical potential in the forward direction of the memory element 30, as described above. With the active layer 34 (and memory element 30) in a high-resistance or substantially non-conductive state, the memory element 30 will not conduct significant current, which indicates that the memory element 30 is in its erased state.

While the above-described memory element is effective in operation, it will be understood that it is desirable to increase overall operational efficiency by, for example, increasing switching speed and providing greater operational stability of the memory element.

Therefore, what is needed is a memory element with such improved operational characteristics.

DISCLOSURE OF THE INVENTION

Broadly stated, the present memory device comprises first and second electrodes, a passive layer between the first and second electrodes and on and in contact with the first electrode, and an active layer between the first and second electrodes and on and in contact with the passive layer and second electrode, for receiving a charged specie from the passive layer, the active layer comprising a mixture of (i) a first polymer, and (ii) a second polymer for promoting substantially uniform distribution of the charged specie in the active layer. The inclusion of the second polymer in the blend provides a high mobility channel to facilitate ion transport into the active layer. Furthermore, since both the materials in the blend are polymers, an improved interface and/or junction between the two is provided. This promotes a more uniform distribution of the charged specie into the active layer i.e., preventing a localized injection of the charged species. These features result in a memory element with improved stability, a more controllable ON-state resistance, improved switching speed and a lower programming voltage.

The present invention is better understood upon consideration of the detailed description below, in conjunction with the accompanying drawings. As will become readily apparent to those skilled in the art from the following description, there is shown and described an embodiment of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of an illustrative embodiment when read in conjunction with the accompanying drawings, wherein:

BEST MODE(S) FOR CARRYING OUT THE INVENTION

Reference is now made in detail to a specific embodiment of the present invention which illustrates the best mode presently contemplated by the inventors for practicing the invention.

Figure 3:
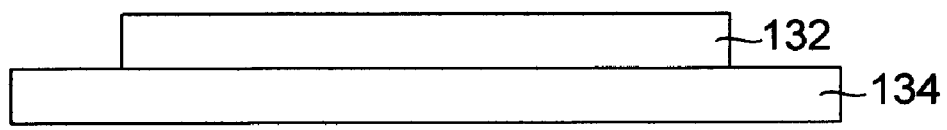
FIGS. 3-6 are sectional views illustrating steps in the fabrication of an embodiment of the present memory element.
Figure 4:
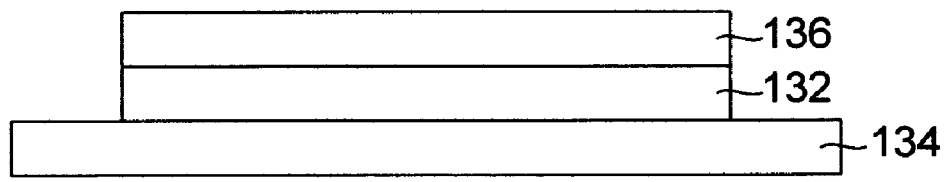

FIGS. 3-6 illustrate a process for fabricating a first embodiment of memory element 130 in accordance with the present invention. Initially, an electrode 132 is formed on a substrate 134 (FIG. 3). The electrode 132 may be formed by any suitable technique, such as physical vapor deposition, i.e. PVD (such as thermal vacuum evaporation, e-beam deposition or sputtering), ion plating, chemical vapor deposition, i.e. CVD (such as metal-organic CVD, i.e. MOCVD), plasma-enhanced CVD, i.e. PECVD, and the like. The electrode 132 in this embodiment is copper, but it will be understood that the electrode 132 can be formed of any of a number of materials including aluminum, barium, calcium, chromium, cobalt, copper, germanium, gold, magnesium, manganese, molybdenum, indium, iron, nickel, palladium, platinum, ruthenium, samarium, silver, tantalum, titanium, tungsten, zinc, metal oxides, polysilicon, doped amorphous silicon, metal silicide, metal carbide, metal nitrides, magnesium-silver alloy, nickel-cobalt alloy, iron-nickel-cobalt alloy, iron-nickel alloy, nickel-copper alloy, and nickel-chromium alloy. Next, a passive layer 136, in this embodiment copper sulfide, is formed over, on and in contact with the electrode 132 (FIG. 4). Examples of other conductivity facilitating compounds that may constitute the passive layer 136 include one or more of copper sulfide ($Cu_xS$, $1 \leq x \leq 2$), copper rich copper sulfide, copper oxide ($CuO$, $Cu_2O$), copper selenide ($Cu_2Se$, $CuSe$), copper telluride ($Cu_2Te$, $CuTe$), manganese oxide ($MnO_2$), titanium dioxide ($TiO_2$), indium oxide ($I_3O_4$), silver sulfide ($Ag_2S$, $AgS$), gold sulfide ($Au_2S$, $AuS$), iron oxide ($Fe_3O_4$), cobalt arsenide ($CoAs_2$), nickel arsenide ($NiAs$), mixtures thereof, and the like. The conductivity facilitating compounds do not necessarily dissociate into ions under the strength of the electric field, although ions may move through them. The passive layer may contain two or more subpassive layers, each sublayer containing the same, different, or multiple conductivity facilitating compounds.

Figure 5:
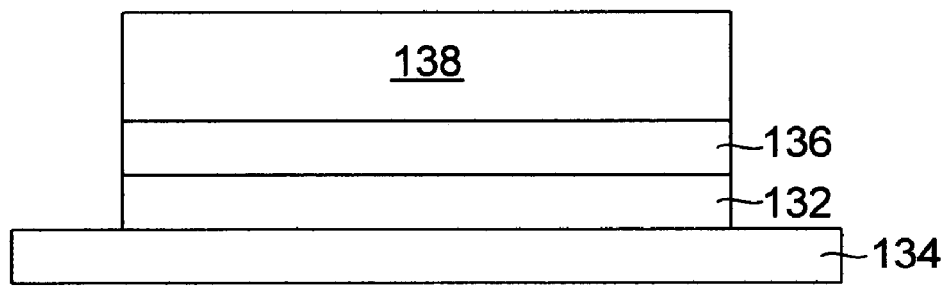

Then, an active layer 138 in the form of a coating layer or film is provided on, over and in contact with the passive layer 136 (FIG. 5). The active layer 138 is a mixture or blend of two or more polymers, one a readily doped active polymer, and the other a polymer that promotes electrical specie transport (such as ion transport) within the active layer 138. In this embodiment the readily doped polymer is provided as F8T2 and the electrical specie transport polymer is provided as poly(ethyleneoxide) (PEO).

The chemical structure of F8T2 is:

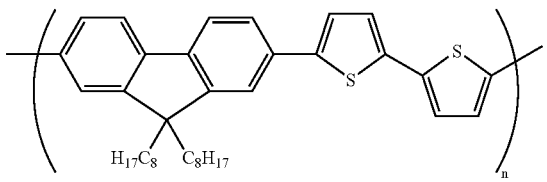

The chemical structure of poly(ethyleneoxide) (PEO) is

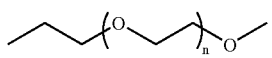

The F8T2 and PEO may with advantage be blended in the range from 10% F8T2-90% PEO to 90% F8T2-10% PEO, with particular advantage for the range 20% F8T2-80% PEO to 30% F8T2-70% PEO.

The F8T2-PEO layer 138 may range from for example 50 angstroms to 1 mm thick, preferably ranging from 50 angstroms to 1000 angstroms thick, and may be deposited by spin-on techniques. In this particular embodiment, the F8T2-PEO mixture is spun onto the layer 136 in the form of, for example, 1.5 wt % polymer in o-xylene solvent, at 1500 rpm for 30 seconds with a 750 rpm/s ramp, to provide a layer 36 approximately 700 angstroms thick. The film is then dried at 90° C. under vacuum for 30 minutes. An optional curing step can be undertaken at this point, at a temperature of 250-350° C. This spin-on step provides uniform coverage of elements thereunder.

Figure 6:
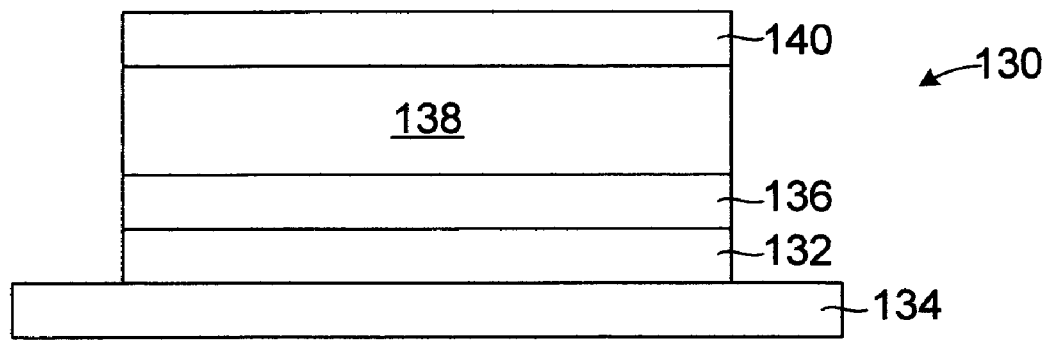

Then, an electrode 140 is formed to a desired thickness on, over and in contact with the active layer 138 (FIG. 6). The electrode 140 in this embodiment is titanium, but it will be understood that the electrode 140 may be formed of any the materials listed with regard to electrode 132, and may be formed by the techniques listed with regard to electrode 132.

Figure 1:
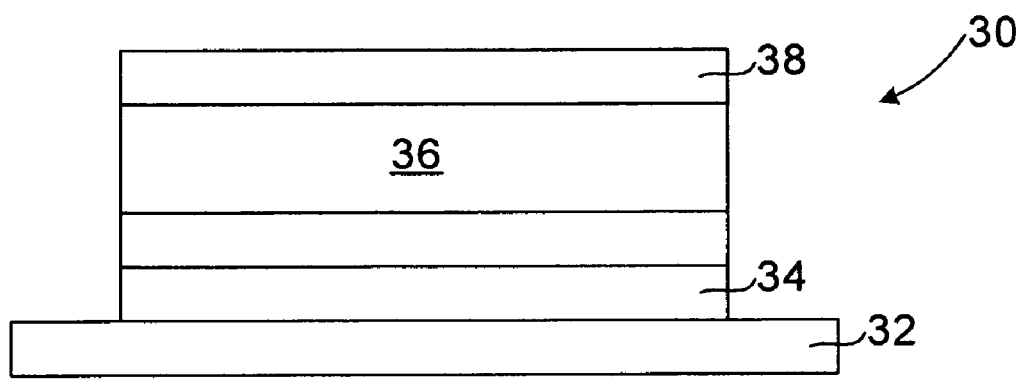
FIG. 1 is a cross-sectional view of an above-described memory element.
Figure 2:
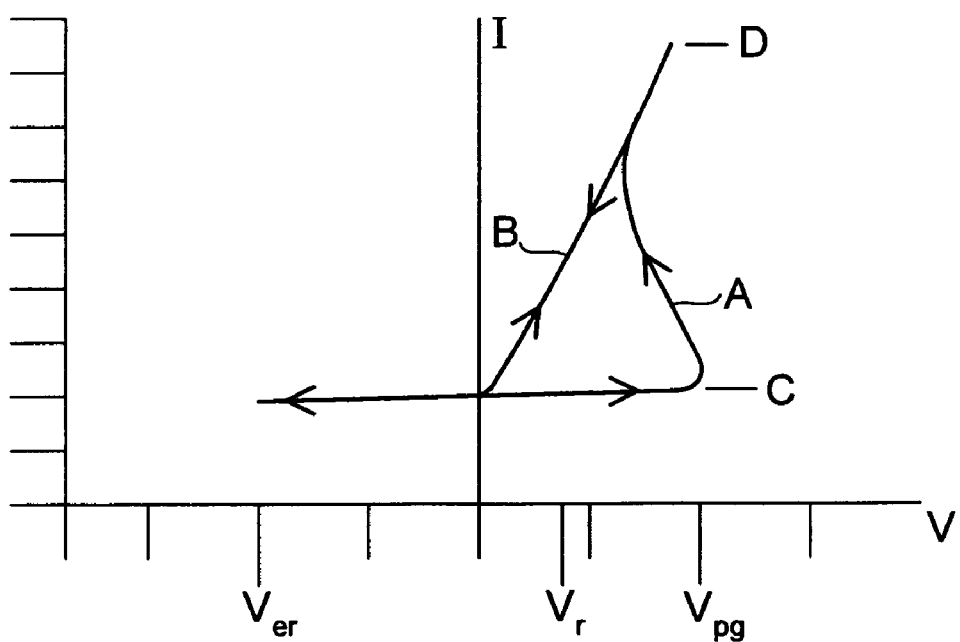
FIG. 2 is a plot of current vs. voltage illustrating operating characteristics of the memory device of FIG. 1.
Figure 7:
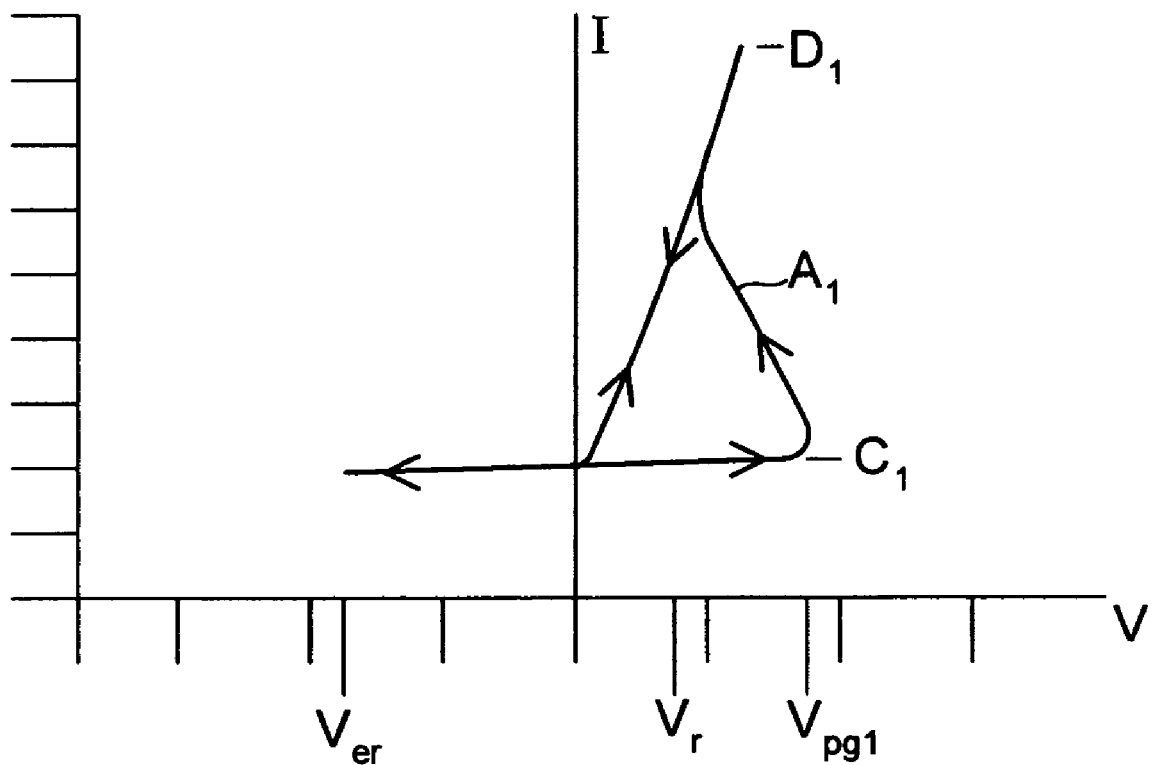
FIG. 7 is a plot of current vs. voltage illustrating operating characteristics of the memory device of FIG. 6.

FIG. 6 illustrates the fabricated memory element 130, wherein the layers 136, 138 are formed between the electrodes 132, 140. The programming, reading and erasing of the memory element 130 is substantially as described above with regard to memory element 30. The inclusion of the ion transport promoting PEO in the active layer 138 promotes substantially uniform and even distribution of the charged specie in and throughout the active layer. This in turn improves operation of the present memory device as compared to prior art devices. The inclusion of PEO as part of the blend promotes and provides a high mobility channel to facilitate ion transport into the active layer. With both the materials in the blend being polymers, an improved interface and/or junction between the two is provided, promoting and providing a substantially uniform and even distribution of the charged specie in and throughout the active layer i.e., preventing a localized injection of the charged species. These features result in a memory element with a more controllable ON-state resistance, improved switching speed and a lower programming voltage. These features result in a memory element with improved switching speed, i.e., a decrease in the time taken from point $C_1$ to point $D_1$ on the curve $A_1$ of FIG. 7, more controllable on-state resistance ($B_1$, FIG. 7), and lower programming voltage ($V_{pg1}$, FIG. 7), as compared to the previous device (FIG. 2).

Furthermore, in the prior art device, it has been found that over a period of time and under certain conditions, the low-resistance or conductive state of a programmed memory element 30 may be undesirably diminished. That is, under certain conditions, copper ions drawn into the active layer 36 during the programming step, instead of remaining in the active layer 36 in a stable matter to retain the programmed state of the memory element 30, are not so retained therein at a level necessary to provide the desired conductive or low-resistance state. For example, with the memory element 30 being part of an array including many such memory elements, when an erase electrical potential $V_{er}$ is applied to a selected memory element from higher to lower potential in the reverse direction thereof, typically, other (non-selected) memory elements in the array also have applied thereto an electrical potential from higher to lower potential in the reverse direction thereof. While this electrical potential is not of sufficient magnitude to erase a non-selected programmed memory element, the application of this potential can cause some copper ions to be repelled from the active layer 36 toward the electrode 32 and into the superionic layer 34 of that non-selected memory element. Over repeated applications of such electrical potential, the number of copper ions undesirably moved from the active layer 36 toward the electrode 32 and into the superionic layer 34 can reach a level that undesirably reduces the conductivity of that non-selected memory element from its programmed state. As another example, over a period of time, under the influence of internal electric fields (without application of external electrical potential), copper ions in the active layer of a programmed memory element may drift from the active layer into the passive layer, again undesirably reducing the conductivity of a programmed memory element.

In the present approach, because of the inclusion of the ion transport promoting PEO in the active layer 138 which promotes substantially uniform and even distribution of the charged specie in and throughout the active layer, the memory device retains its programmed state in a more stable manner, overcoming the problem described above, wherein in certain situations, metal ions (such as copper ions) undesirably move from the active layer, in turn undesirably reducing the conductivity of the active layer and causing degradation or failure of performance.

It will be understood that other ion transfer promoting polymer materials such as poly(methylmethacrylate), poly(ethyleneglycol), poly(caprolactone) and poly(propyleneoxide) and the like may be used in place of or in addition to PEO, and in any combination as chosen, dependent on the desired operating characteristics of the memory element 130.

The foregoing description of the embodiment of the invention has been presented for purposes of illustration and description. It is not intended to be exhaustive or to limit the invention to the precise form disclosed. Other modifications or variations are possible in light of the above teachings.

The embodiment was chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A memory device comprising:
   first and second electrodes;
   a passive layer between the first and second electrodes; and
   an active layer between the first and second electrodes for receiving a charged specie from the passive layer, the active layer comprising a material for promoting substantially uniform distribution of the charged specie in the active layer.

2. The memory device of claim 1 wherein the active layer comprises (i) a first material, and (ii) a second material, the second material promoting substantially uniform distribution of the charged specie in the active layer.

3. The memory device of claim 2 wherein the active layer comprises a mixture of the first and second materials.

4. The memory device of claim 3 wherein the second material comprises a polymer.

5. The memory device of claim 4 wherein the first material comprises a polymer.

6. The memory device of claim 4 wherein the second material comprises at least one material selected from the group consisting of poly(ethyleneoxide), poly(methylmethacrylate), poly(ethyleneglycol), poly(caprolactone) and poly(propyleneoxide).

7. The memory device of claim 6 wherein the first material comprises poly[(9,9-dioctylfluorenyl-2,7-diyl)-co-alt-5,5'-(2,2'bithiophene) (F8T2).

8. A memory device comprising:
   first and second electrodes;
   a passive layer between the first and second electrodes and on and in contact with the first electrode; and
   an active layer between the first and second electrodes and on and in contact with the passive layer and second electrode, for receiving a charged specie from the passive layer, the active layer comprising a mixture of (i) a first polymer, and (ii) a second polymer for promoting substantially uniform distribution of the charged specie in the active layer.

9. The memory device of claim 8 wherein the second polymer comprises at least one material selected from the group consisting of poly(ethyleneoxide), poly(methylmethacrylate), poly(ethyleneglycol), poly(caprolactone) and poly(propyleneoxide).

10. The memory device of claim 9 wherein the first polymer comprises poly[(9,9-dioctylfluorenyl-2,7-diyl)-co-alt-5,5'-(2,2'bithiophene) (F8T2).

* * * * *